(12) United States Patent
Banin et al.

(10) Patent No.: US 8,088,994 B2
(45) Date of Patent: Jan. 3, 2012

(54) LIGHT CONCENTRATING MODULES, SYSTEMS AND METHODS

(75) Inventors: Yoav Banin, Piedmont, CA (US); Gino D'Ovidio, L'Aquila (IT); Giovanni Lanzara, Rome (IT)

(73) Assignee: Solergy, Inc., Oakland, CA (US)

( * ) Notice: Subject to any disclaimer, the term of this patent is extended or adjusted under 35 U.S.C. 154(b) by 265 days.

(21) Appl. No.: 11/963,176

(22) Filed: Dec. 21, 2007

(65) Prior Publication Data

US 2009/0159115 A1  Jun. 25, 2009

(51) Int. Cl.
*H01L 31/0232* (2006.01)
*F24J 2/12* (2006.01)

(52) U.S. Cl. ......... 136/259; 136/246; 126/690; 250/238

(58) Field of Classification Search .......... 136/243–465; 250/203.4, 553, 200, 239, 238; 126/569–713
See application file for complete search history.

(56) References Cited

U.S. PATENT DOCUMENTS

| | | | |
|---|---|---|---|
| 4,002,031 A | 1/1977 | Bell | |
| 4,080,221 A | 3/1978 | Manelas | |
| 4,147,157 A | 4/1979 | Zakhariya | |
| 4,149,903 A | 4/1979 | Lindmayer | |
| 4,153,039 A | 5/1979 | Carroll | |
| 4,166,917 A | 9/1979 | Dorfeld et al. | |
| 4,177,083 A | 12/1979 | Kennedy | |
| 4,248,643 A | 2/1981 | Peters | |
| 4,249,516 A | 2/1981 | Stark | |
| 4,326,012 A | 4/1982 | Charlton | |
| 4,337,758 A * | 7/1982 | Meinel et al. ............... 126/684 |
| 4,350,143 A | 9/1982 | Laing et al. | |
| 4,388,481 A | 6/1983 | Uroshevich | |
| 4,392,007 A | 7/1983 | Barkats et al. | |
| 4,392,008 A | 7/1983 | Cullis et al. | |
| 4,392,482 A | 7/1983 | Chang | |
| 4,455,826 A | 6/1984 | Knoos | |
| 4,473,065 A | 9/1984 | Bates | |
| 4,520,794 A | 6/1985 | Stark et al. | |
| 4,522,193 A | 6/1985 | Bates | |
| 4,566,434 A | 1/1986 | Lindenbauer | |
| 4,672,948 A | 6/1987 | Rosende | |
| 4,785,633 A | 11/1988 | Meijer et al. | |
| 4,830,678 A * | 5/1989 | Todorof et al. ............... 136/259 |
| 4,911,144 A | 3/1990 | Godett et al. | |
| 4,943,325 A | 7/1990 | Levy | |
| 5,118,361 A * | 6/1992 | Fraas et al. .................... 136/246 |
| 5,153,780 A | 10/1992 | Jorgensen | |
| 5,154,777 A * | 10/1992 | Blackmon et al. ............. 136/245 |
| 5,269,851 A * | 12/1993 | Horne ........................... 136/248 |

(Continued)

*Primary Examiner* — Basia Ridley
*Assistant Examiner* — Christina Chern
(74) *Attorney, Agent, or Firm* — The Small Patent Law Group; Dean Small; Jason P. Gross

(57) ABSTRACT

A light concentrating module for transforming light into at least one of electrical and thermal energy is provided. The light concentrating module may be coupled in flow communication with a fluid conversion module and include a primary optical element that has a reflective surface with a plurality of contoured sections. Each contoured section is shaped to reflect light that impinges the contoured section toward a corresponding focal region. The module may also have a receiver system that includes a plurality of energy conversion members positioned proximate to corresponding focal regions. The receiver system also has a working fluid passage for carrying a working fluid that absorbs the thermal energy. The working fluid can be conveyed away from the receiver system through a mounting post that holds the receiver system. In addition, the module may also generate electricity.

26 Claims, 15 Drawing Sheets

U.S. PATENT DOCUMENTS

| | | |
|---|---|---|
| 5,465,708 A | 11/1995 | Goebel et al. |
| 5,505,789 A | 4/1996 | Fraas et al. |
| 5,586,549 A | 12/1996 | Hartenstine et al. |
| 5,860,414 A | 1/1999 | Steinmann |
| 6,057,505 A * | 5/2000 | Ortabasi ................. 136/246 |
| 6,384,320 B1 | 5/2002 | Chen |
| 6,434,942 B1 | 8/2002 | Charlton |
| 6,630,622 B2 | 10/2003 | Konold |
| 6,818,818 B2 | 11/2004 | Bareis |
| 6,841,891 B1 | 1/2005 | Luchinskiy et al. |
| 7,299,633 B2 | 11/2007 | Murphy et al. |
| 7,331,178 B2 | 2/2008 | Goldman |
| 2003/0075213 A1 | 4/2003 | Chen |
| 2003/0140960 A1 | 7/2003 | Baum et al. |
| 2005/0011513 A1 | 1/2005 | Johnson |
| 2005/0133082 A1 | 6/2005 | Konold et al. |
| 2006/0225730 A1 * | 10/2006 | Anderson ................. 126/600 |
| 2006/0243319 A1 | 11/2006 | Kusek et al. |
| 2007/0157922 A1 | 7/2007 | Radhakrishnan et al. |
| 2007/0215198 A1 | 9/2007 | Jiang et al. |
| 2007/0227574 A1 | 10/2007 | Cart |
| 2007/0256724 A1 | 11/2007 | Fork et al. |
| 2007/0256725 A1 | 11/2007 | Fork et al. |

* cited by examiner

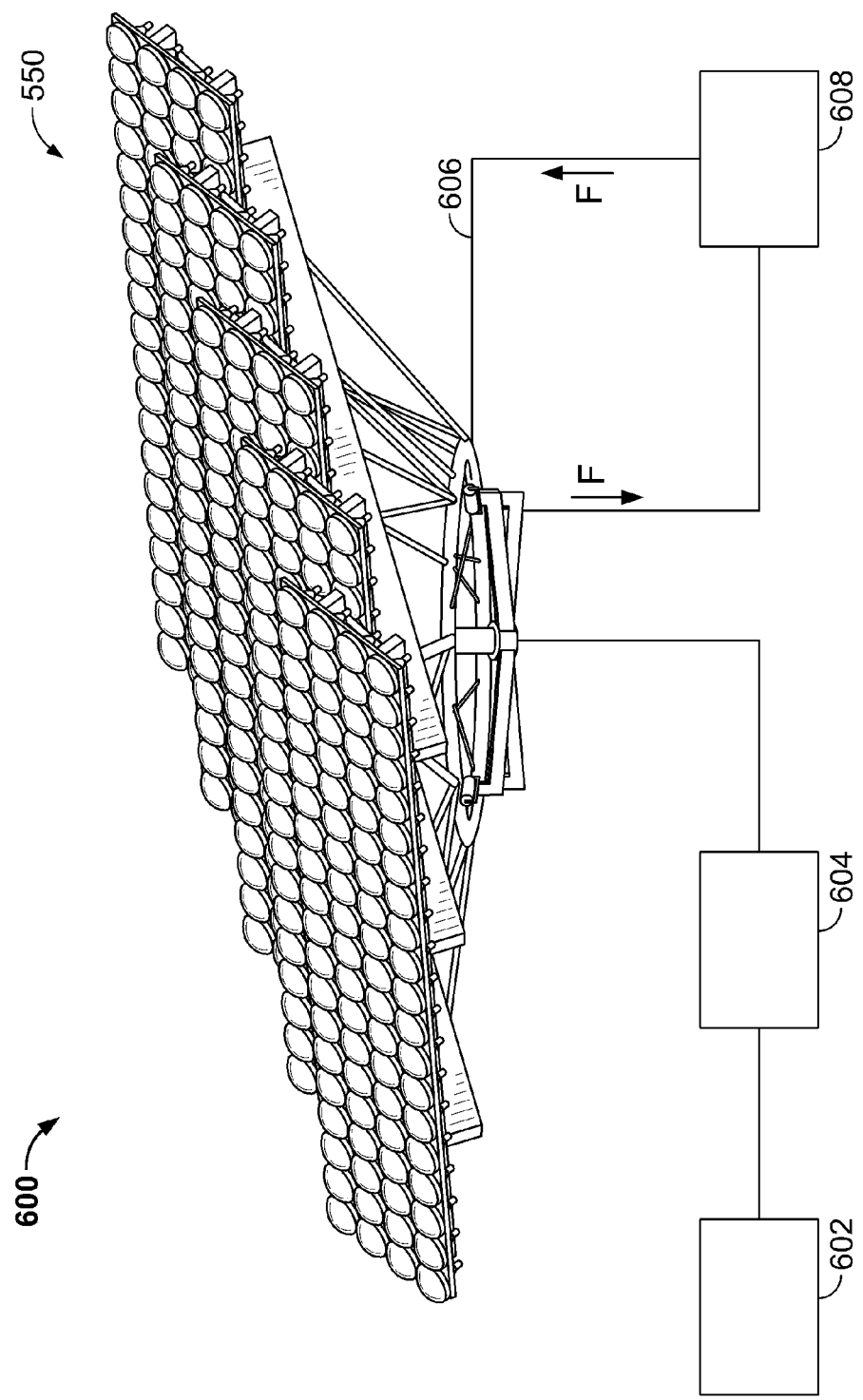

LIGHT CONCENTRATING MODULES, SYSTEMS AND METHODS

BACKGROUND OF THE INVENTION

The invention relates generally to concentrating optics, and more particularly to light concentrating modules and methods for generating power.

Light concentrating modules (e.g., solar concentrating collectors) exist today for generating electricity with a photovoltaic (PV) cell. Separate light concentrating modules exist today for capturing thermal energy through the transfer of heat into a working fluid. In both types of modules, a substantial portion of the available energy from the sun is not captured and converted into usable energy. For example, in the case of collectors that generate only electricity, a substantial amount of thermal energy is dissipated into the surroundings. By capturing and applying this waste heat, it would be possible to increase the overall energy conversion efficiency of the module, increase the energy production per square meter of the installed module, and enable applications such as hot water heating, space heating, and air conditioning in addition to electricity generation.

At least one conventional system has been proposed to combine electricity and heat generation. In this combined system, a trough-type reflector configuration is used where light rays are reflected by a trough-shaped optical element to concentrate the light into a linear focal region. The trough-type configuration, however, provides relatively low light concentration levels (e.g., below 100× and more typically somewhere in the range of 10× to 40×). Also, the trough-shape optical element is difficult to adjust for tracking the light source which may negatively affect the conversion efficiency. Systems of this type generally rely on silicon-based PV cells which are less efficient than available alternatives such as III-V based multijunction solar cells. Therefore, while attempting to make use of more of the available energy from the sun, the conventional system relies on sub-optimal solar collector configurations with low concentration levels and low energy conversion efficiencies.

Other known light concentrating systems use optical elements (e.g., dishes) that provide a point focal region. Conventional systems that use a point focal region are typically designed only for electricity generation and are unable to capture the dissipating thermal energy. Those that may be targeted for capturing the thermal energy in addition to electric energy suffer from inefficient capture of the light rays caused by shading of the primary reflective surface by either secondary optical elements or the receiver system itself, thereby reducing the quantity of light arriving at the primary reflector and subsequently the receiver. Another cause of inefficient capture of the light rays is the use of too many optical elements, which may introduce significant loss of light rays due to absorption and/or reflection losses at each optical interface.

Furthermore, in order to generate sufficient quantities of power, conventional point focal light concentrators may be assembled into an array. This necessitates the fabrication, assembly, inter-connection, and installation of a large number of such light concentrators which can cause the cost of a complete power generating system based on light concentrators to be quite high. In addition, the arrays may suffer from reduced power production per unit area due to incomplete utilization of available space. For example, gaps may exist between light concentrating modules when arranged in an array.

Another problem with current light concentrating systems is that they are not designed for easy maintenance, repair, or component upgrades over the envisioned lifetime of the system. Many are constructed from materials or configured in such a way that they are not designed to survive the rigors of many years of consistent operation in the intended environment without significant performance degradation. In addition, many of these systems are not designed for high-volume manufacture at low cost, while maintaining long term reliability. All of these factors combine to make the initial installation cost, as well as the total cost of ownership, several times higher than the cost of competing, non-solar sources of energy.

Thus, there is a need for co-generating light concentrating modules and methods that operate with sufficient PV conversion efficiencies, while also providing thermal energy. There is also a need for light concentrating modules that maximize power production for the given area, maximize capture and energy conversion of light rays, and accomplish this in a manner that reduces costs related to light concentrator fabrication, assembly, inter-connection, and installation. In addition, there is a need for a light concentrating module that may be easily repaired, maintained, or updated throughout the lifetime of a system.

BRIEF DESCRIPTION OF THE INVENTION

In one embodiment, a light concentrating module that is coupled in flow communication with a fluid conversion module to store, use, and/or convert or dispose of thermal energy is provided. The light concentrating module includes a primary optical element that has a reflective surface including a plurality of contoured sections. Each contoured section is shaped to reflect light that impinges the contoured section toward a corresponding focal region. The module also includes a receiver system that is joined to the primary optical element and has a plurality of energy conversion members that are positioned proximate to corresponding focal regions. The receiver system also has a working fluid passage for carrying a working fluid proximate to the energy conversion members to absorb the thermal energy. The working fluid passage includes an outlet that is configured to communicate with a fluid conversion module in order to convey the working fluid between the energy conversion members and the fluid conversion module.

Optionally, the receiver system may include a plurality of secondary optical elements that are positioned proximate to the energy conversion members. Each secondary optical element may be configured to direct the light toward the energy conversion member. Also, the primary optical element may define a central axis that extends upward through the primary optical element. The energy conversion members may be held in a clustered arrangement about the central axis of the primary optical element.

In another embodiment, a light concentrating module is provided that includes a primary optical element with a reflective surface having a plurality of contoured sections. Each contoured section is shaped to reflect light impinging on the contoured section toward a corresponding focal region. The module also includes a receiver system that is joined to the primary optical element and has a plurality of energy conversion members positioned proximate to corresponding focal regions. The module further includes a mounting post that has a proximal end secured to the primary optical element and a distal end located proximate to the focal regions of the primary optical element. The mounting post has working fluid passages that extend between the proximal and distal ends for carrying a working fluid to and from the energy conversion members in order to absorb the thermal energy.

Yet still in another embodiment, a light concentrating module is provided that includes a primary optical element having a reflective surface with a plurality of contoured sections. Each contoured section is shaped to reflect light impinging on the contoured section toward a corresponding focal region. The module also includes a receiver system that has a plurality of energy conversion members positioned proximate to corresponding focal regions. The module further includes a header having a fluid chamber and a body. The body supports the plurality of energy conversion members at positions distributed about the fluid chamber such that a common reservoir of working fluid flows proximate to the energy conversion members to absorb the thermal energy.

BRIEF DESCRIPTION OF THE DRAWINGS

FIG. 19 is a schematic illustrating an energy conversion system that may be formed in accordance with one embodiment.

DETAILED DESCRIPTION OF THE INVENTION

As will be discussed in greater detail below, light concentrating (LC) modules include reflective surfaces that are configured to concentrate light energy into or near a predetermined region where the light energy may be converted to electricity and/or is used to heat a working fluid. As used herein, the term "light," is not limited to visible light or sunlight, but instead encompasses a wide range of wavelengths, as well as electromagnetic radiation of all wavelengths. As used herein, the term "acceptance angle" is an angle at which the LC module or concentrator may deviate from a desired alignment with respect to the light source, but still maintain a desired percentage of optical efficiency (e.g., 90%). As used herein, the term "working fluid" is any fluid or gas used to absorb and transfer thermal energy. As used herein, the term "optical element" means any material or apparatus that affects the propagation of light. A "non-imaging" optical element, as used herein, is an optical element that does not necessarily focus the light rays to a point or reproduce the image of the light reflected by the surface into a predetermined region or onto an energy conversion member. As used herein, the term "focal region" is not limited to a focal point or focus but may include the region where the light rays reflected by a surface are substantially concentrated. As used herein, the term "ridge" is generally a shared border of two surfaces that may meet at a sharp edge or have the shape of a cusp or may be a thin flat band formed therebetween.

Figure 1:
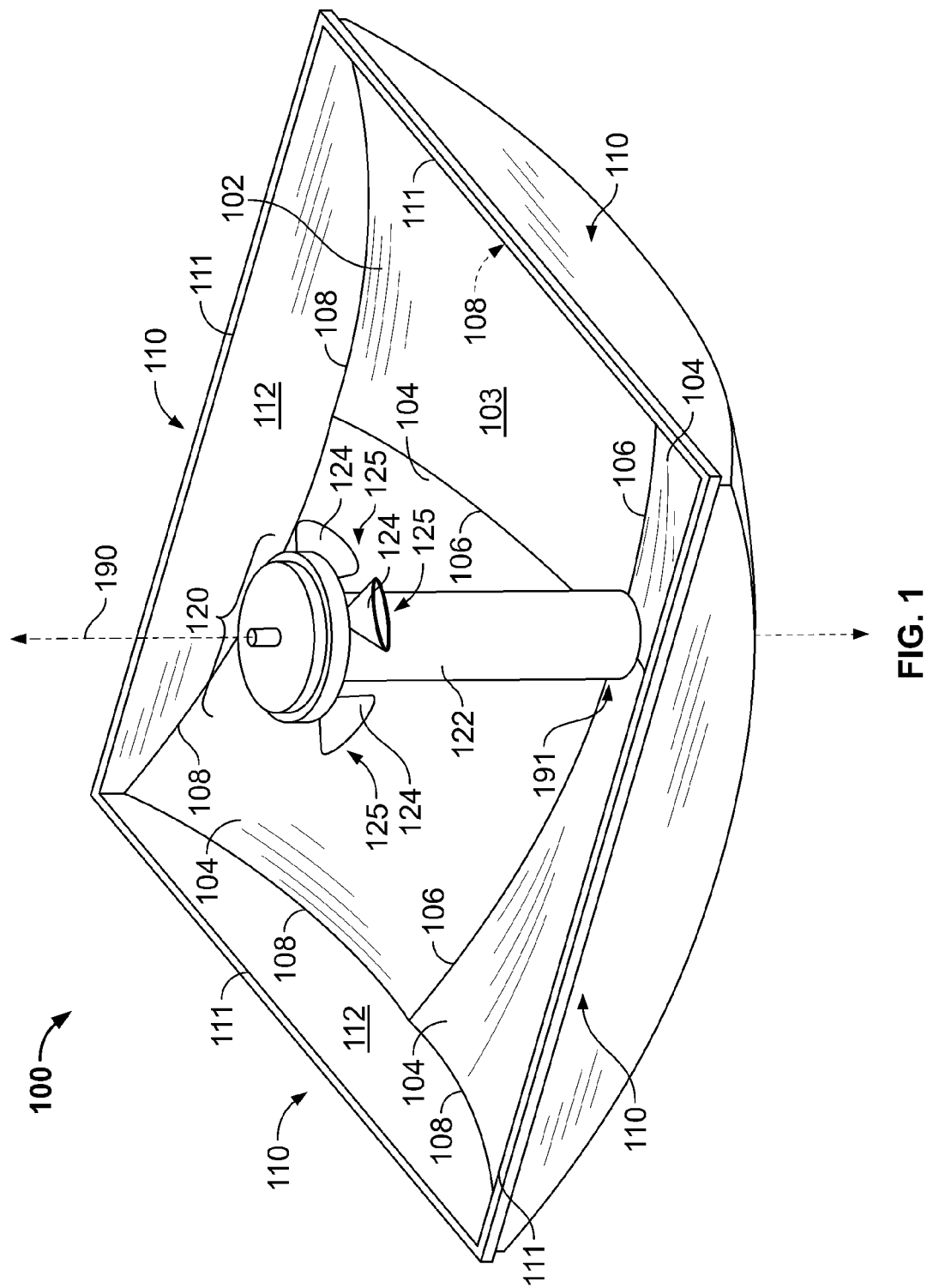
FIG. 1 is a perspective view of a light concentrating module formed in accordance with one embodiment.
Figure 2:
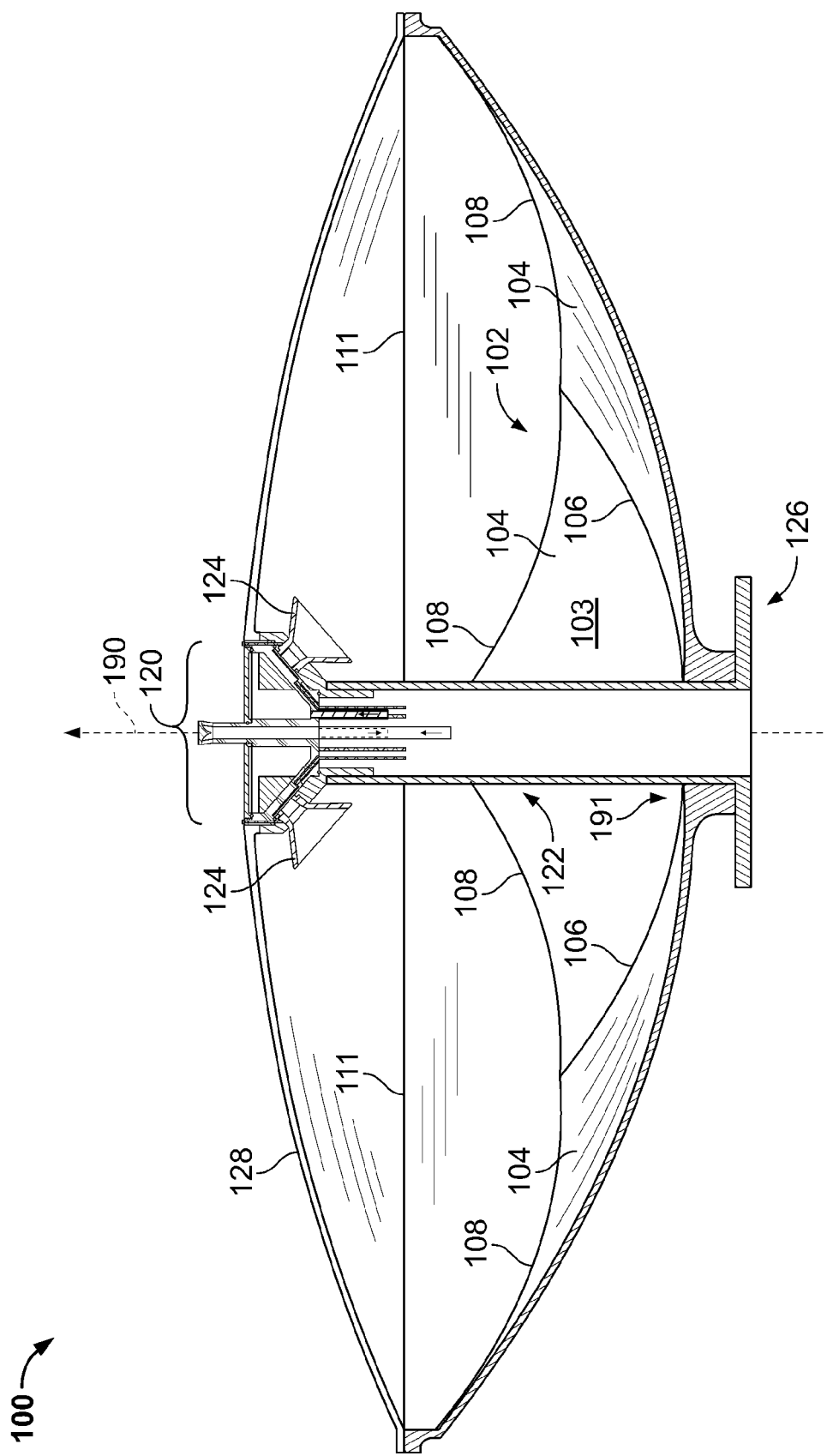
FIG. 2 is a side view of the module shown in FIG. 1.

FIGS. 1 and 2 are a perspective view and a cross-sectional view, respectively, of an LC module 100 that includes a primary optical element 102 that is substantially concave and has a reflective surface 103 forming a plurality of contoured sections 104. The LC module 100 also has a plurality of sides 110 (FIG. 1) where each side 110 has an edge 111. The edges 111 form a perimeter of the LC module 100 or, more specifically, the primary optical element 102. As shown in FIG. 1, the perimeter may have a substantially rectangular or square shape. The LC module 100 may include one or more secondary optical elements 124. Furthermore, the secondary optical elements 124 may be held by a receiver system 120. The receiver system 120 is positioned a distance away from the reflective surface 103 and may rest upon a mounting post 122 that projects from a proximal end near the primary optical element 102 and extends to a distal end that is located proximate to the receiver system 120. The mounting post 122 and the receiver system 120 may be co-linear with respect to a central axis 190 extending through a center of the mounting post 122 and the receiver system 120. The mounting post 120 is sized to allow passage of pipes that may contain the working fluid F and/or wires for transmitting electricity. The LC module 100 shown in FIGS. 1 and 2 may be a co-generating module in that the light energy may be both converted to electricity and thermally absorbed by a working fluid F. The LC module may be in flow communication with a fluid conversion module 608 (shown in FIG. 19) so that the working fluid F may then be used for heating, generating electricity, or for other purposes.

Each contoured section 104 is shaped to reflect light toward a corresponding focal region 125 that may occur proximate to, or within, an associated secondary optical element 124. More specifically, the reflective surface 103 of each contoured section 104 has a concave or parabolic shape with respect to ridges that define the contoured sections 104. For example, as shown in FIGS. 1 and 2, each contoured section 104 may have two outer ridges 108 and two inner ridges 106. Each inner ridge 106 extends radially outward from a central area 191 where the central axis 190 extend through, and each outer ridge 108 extends along adjacent to a corresponding side 110 (FIG. 1). The ridges 106 and 108 may connect at substantially perpendicular angles defining the contoured section 104 therebetween. As shown, each inner ridge 106 of one contoured section 104 may be shared by the adjacent contoured section 104. The reflective surface 103 may also form a plurality of outer portions 112 (FIG. 1) that are each defined between one edge 111 and the adjacent outer ridges 108.

The contoured sections 104 may be integrally formed with the primary optical element 102. Alternatively, the contoured sections 104 may be removable from the primary optical element 102 thereby allowing the contoured sections 104 to be cleaned, refinished, or replaced. Also, the contoured sections 104 may be shaped to directly abut the adjacent contoured section(s) 104 when installed. However, in an alternative embodiment, the primary optical element 102 may be an arrangement of contoured sections 104 in which each contoured section 104 is separated from the adjacent contoured section(s) 104.

As shown in FIG. 2, the LC module 100 may have a cover 128. The cover 128 may be integrally formed to have a substantially flat or dome-shaped contour. Alternatively, the cover 128 may include a number of sections (not shown) that are each associated with one contoured section 104 and are configured to transmit light in a predetermined manner for reflection by the associated contoured section 104. The LC module 100 may have a stand 126 for connecting the LC module 100 to a structure, such as the tracking structure 554 shown in FIG. 17.

Although the LC module 100 shown in FIGS. 1 and 2 has four contoured sections 104 that surround the mounting post 122 along the central axis 190, other arrangements are possible for the LC module 100. For example, the perimeter may be shaped as a circle or semi-circle and still include a plurality of contoured sections 104 that reflect light to a corresponding secondary optical element 124. Moreover, the mounting post 122 is not required as part of module 100, which may instead have a receiver system 120 attached to the cover 128 or a beam member coupled to and extending from an edge 111. Also, the mounting post 122 is not required to be positioned within the center along the central axis 190. The mounting post 122 may be placed proximate to one side 110 or extend at an angle from the reflective surface 103. Many arrangements are possible in which a plurality of contoured sections 104 can reflect light to a corresponding secondary optical element 124 or region.

Figure 3:
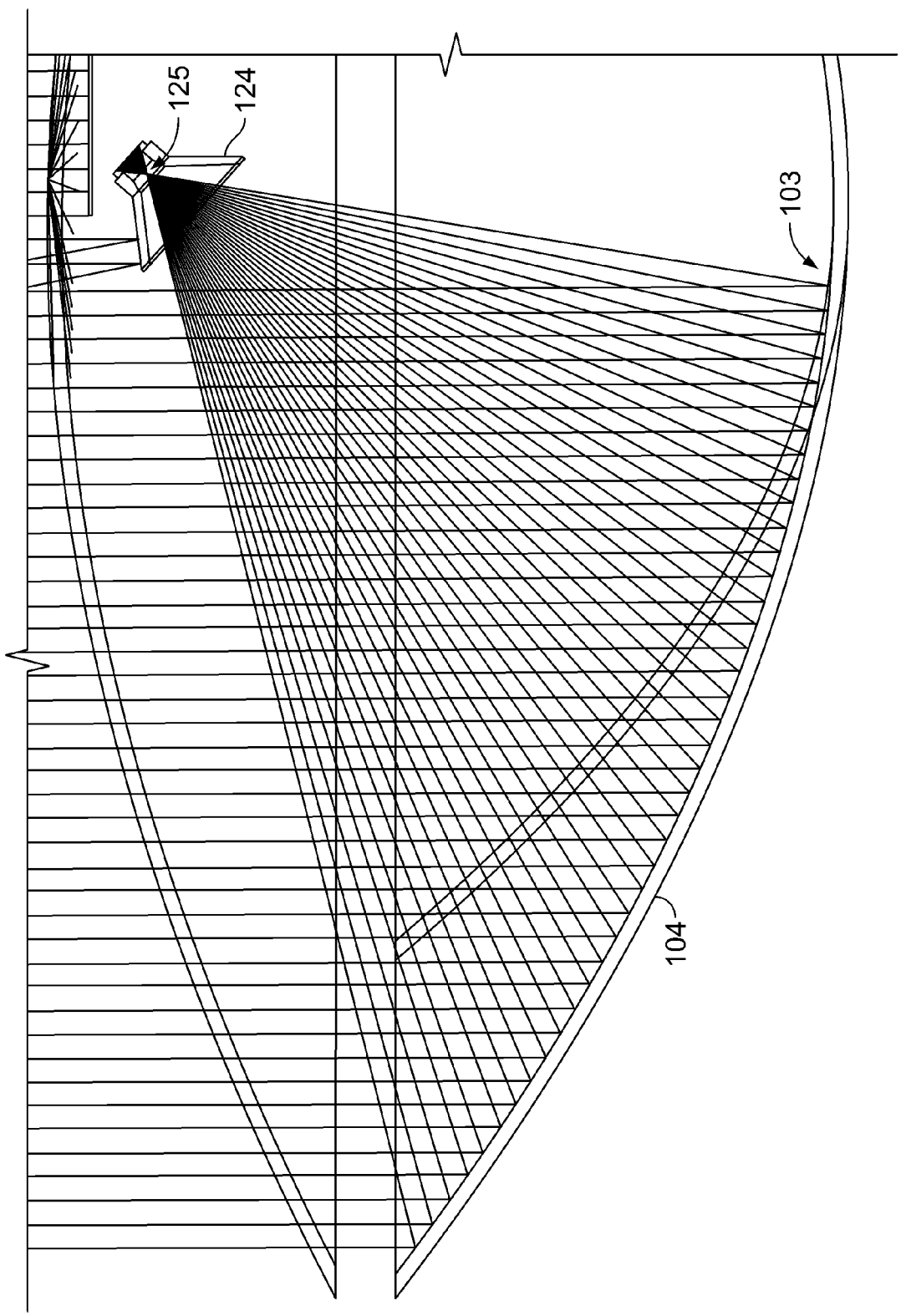
FIG. 3 illustrates reflection of light rays from a contoured section used with the module shown in FIG. 1.
Figure 4:
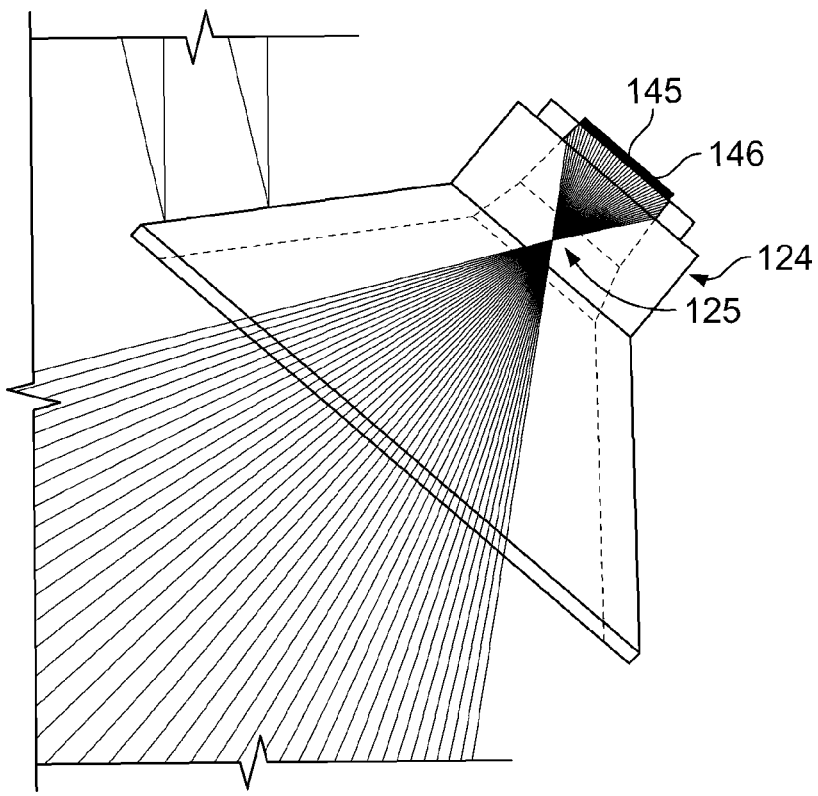
FIGS. 4 and 5 illustrate reflection of light rays by an optical element used with the module shown in FIG. 1.
Figure 5:
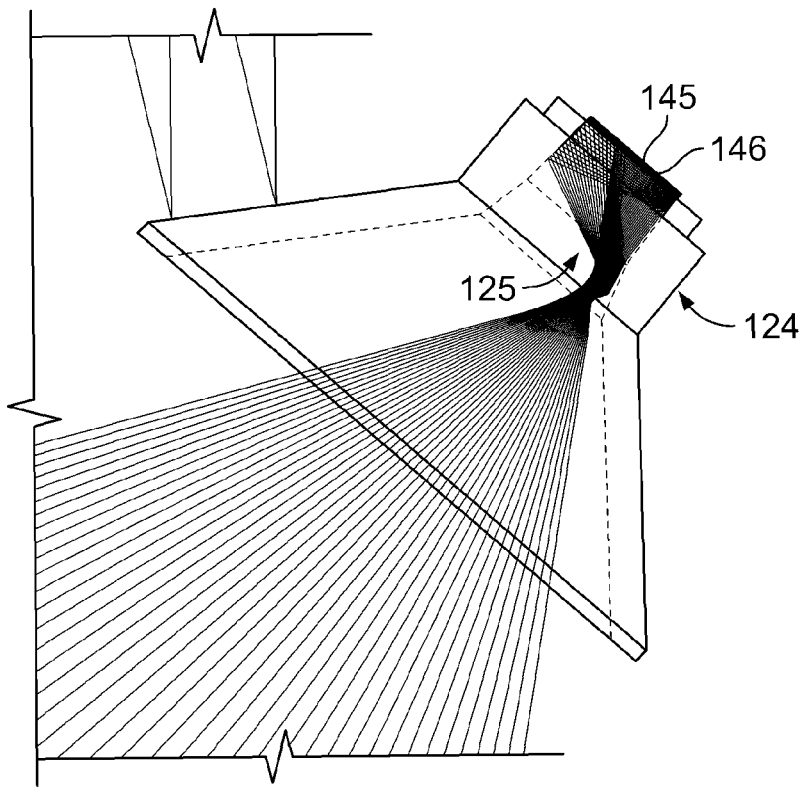

FIGS. 3-5 illustrate light ray reflection from one contoured section 104 into the secondary optical element 124. As shown in FIG. 3, each contoured section 104 of the reflective surface 103 is shaped to reflect impinging light toward a focal region 125 that occurs proximate to or within an associated secondary optical element 124. The secondary optical element 124 may be oriented at an angle with respect to the mounting post 122 (FIG. 2) or the central axis 190 (FIG. 2). FIG. 4 illustrates the path traveled by light rays when the incident angle of the incoming light is about zero degrees. As shown, the light rays converge proximate to or within the focal region 125 and have no interaction with the secondary optical element 124 in order to impinge upon an energy conversion member 145, illustrated in FIGS. 4 and 5 as a PV cell 146. In FIG. 5, the incident angle of the incoming light is non-zero, meaning that there is some alignment error of the LC module 100 with the light source. In this case, errant light rays that would not otherwise impinge upon the energy conversion member 145 are directed by the secondary optical element 124 to impinge upon energy conversion member 145. The PV cell 146 may be, for example, III-V based multifunction solar cells. Alternatively, the LC module 100 may not include the secondary optical element 124. Although the energy conversion member 145 is illustrated as the PV cell 146 in FIGS. 4 and 5, alternative embodiments of the LC module 100 may have other energy conversion members 145. For example, the energy conversion member 145 may be configured solely for the purpose of transferring thermal energy generated by the concentrated light into the working fluid F. The distribution of light on the surface of the PV cell 146 correlates with the distribution of thermal energy absorbed by the PV cell 146. High levels of heat on portions of the PV cell 146 may affect the conversion efficiency and the lifetime of the PV cell 146. The secondary optical element 124 may be designed to optimize the acceptance angle for the LC module 100 (FIG. 1) and/or to provide a more uniform distribution of the light.

Figure 6:
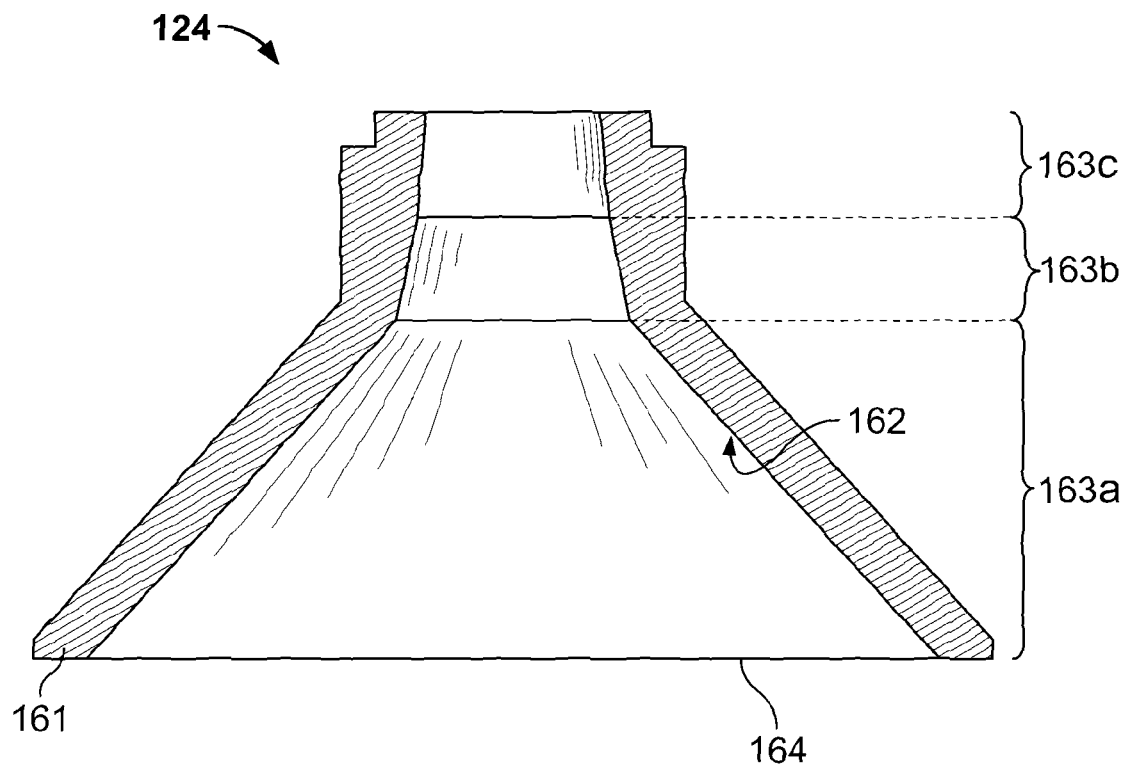
FIG. 6 is a cross-sectional view of the optical element shown in FIGS. 4 and 5.
Figure 7:
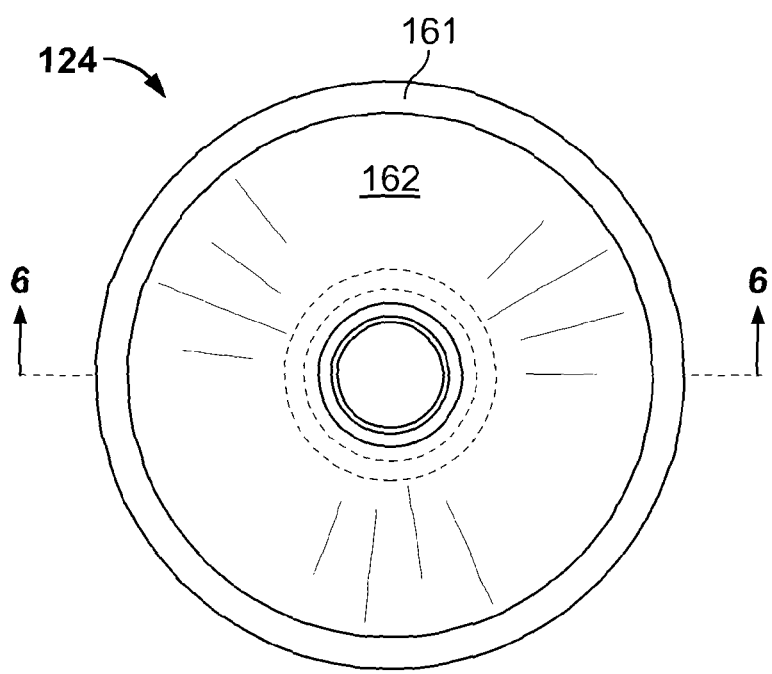
FIG. 7 is a top view of the optical element shown in FIGS. 4 and 5.

FIG. 6 is a cross-sectional view of the secondary optical element 124 that may be used with the receiver system 120, and FIG. 7 is a top view of the secondary optical element 124. The secondary optical element 124 includes a wall 161 having a reflective inner surface 162 that is substantially funnel-shaped. An entrance aperture of the secondary optical element 124 may be open and uncovered or it may include a cover or covers 164 that may be used, for example, to hermetically seal a gas therein or to protect the reflective surface of the secondary optical element 124. As shown in FIG. 6, the inner surface 162 forms one or more funnel portions 163A, 163B, and 163C where diameters of cross-sections of each funnel portion 163A-163C are reducing at a corresponding linear rate. In alternative embodiments, the cross-sections of funnel portions 163A-163C may reduce at a non-linear rate. Furthermore, the funnel portions 163A-163C may be configured differently or additional funnel portions may be formed by the inner surface 162. The funnel portions 163A-163C are configured to reflect the light rays impinging the inner surface 162 toward the PV cell 146 in such a way that increases the acceptance angle of the LC module 100. For example, if the incoming angle of incidence is misaligned from the desired alignment by about zero to about two (2) degrees, the funnel portions 163A-163C operate to redirect the errant light rays toward the surface of the PV cell 146. The funnel portions 163A-163C enable the LC module 100 to maintain a desired percentage of optical efficiency (e.g., 90%) even though the LC module 100 is misaligned. In one embodiment, the funnel portions 163A-163C may redirect light rays to the surface of the PV cell 146 that are misaligned between zero and about one (1) degree and still maintain the desired optical efficiency. Also, the funnel portions 163A-163C can be configured to reflect the lights rays impinging the inner surface 162 toward the PV cell 146 such that the light rays are distributed across the surface of the PV cell 146 in some desired way. For example, the impinging light rays may be distributed substantially uniform across the surface of the PV cell 146. More specifically, the flux of light leaving the secondary optical element 124 and impinging on the surface of the PV cell 146 may be substantially homogenized across the surface of the PV cell 146 in order to reduce the amount of inefficient or damaging heat spots. Alternatively, the light rays may be directed to predetermined areas or portions of an energy conversion member 145 so that the thermal energy is more efficiently transferred into the working fluid F.

Figure 8:
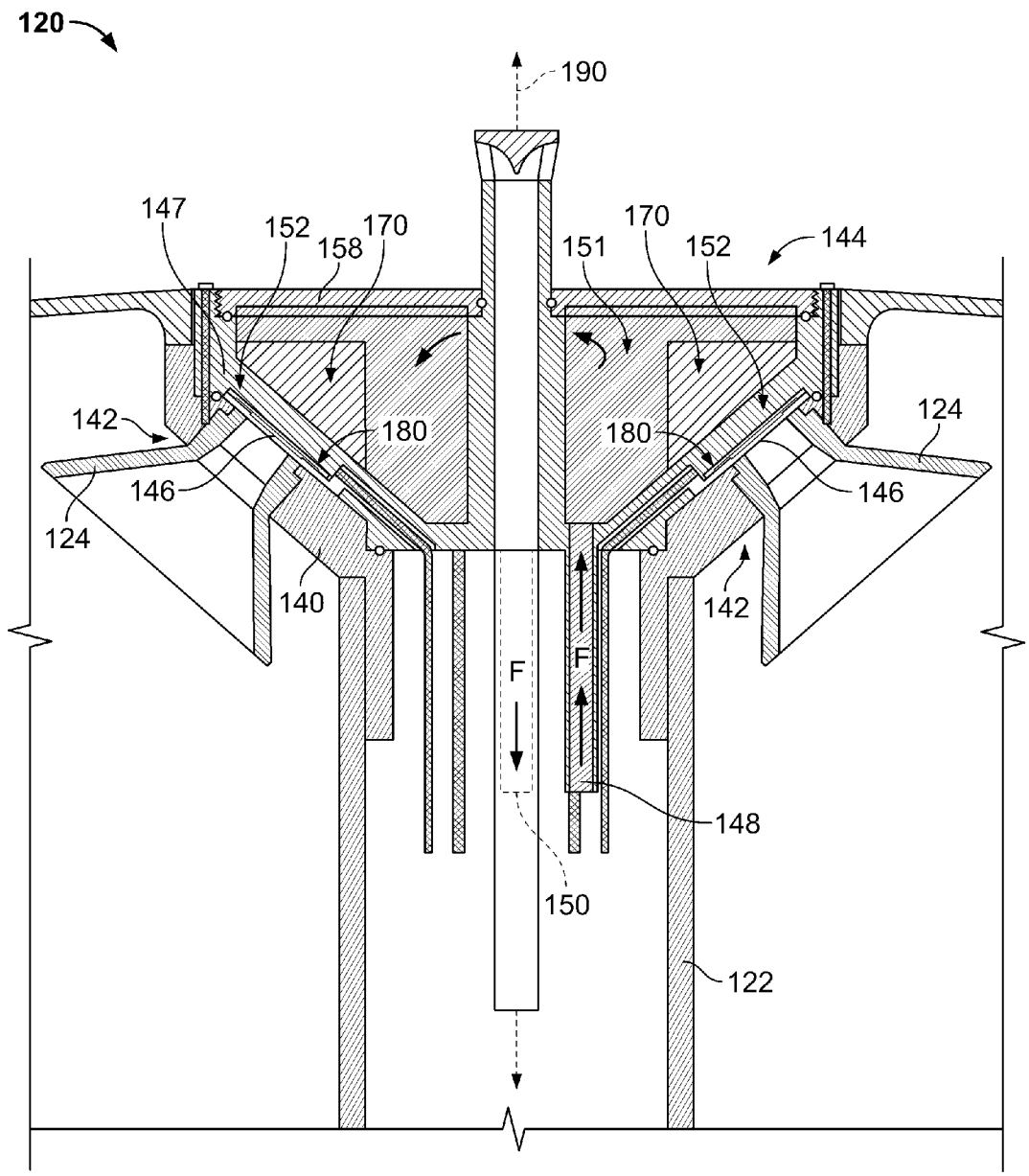
FIG. 8 is a cross-sectional view of a receiver system used with the LC module shown in FIG. 1.

FIG. 8 is an enlarged cross-sectional view of the receiver system 120, which includes a neck support 140 and a header 144. The header 144 is held by the neck support 140 or, in another embodiment, is integrally formed with the neck support 140 and may be substantially concentric with respect to each other. The neck support 140 is configured to engage within a shaft of the mounting post 122. Alternatively, the neck support 140 may be integrally formed with the mounting post 122. The neck support 140 has a plurality of openings 142 for holding the secondary optical elements 124. The openings 142 are oriented to direct the secondary optical elements 124 toward the associated contoured section 104 (FIG. 1). As shown, the secondary optical elements 124 are at an angle with respect to a central axis 190 so that the secondary optical elements 124 may be clustered near each other and can receive and direct the light rays reflected by the associated contoured section 104. The header 144 has a body 147 that includes a plurality of holders 152 that are shaped or formed to hold an energy conversion member 145, such as the PV cell 146. The PV cell 146 may be attached thereon using, for example, a thermally conductive adhesive 180. The holders 152 are configured to orient the PV cell 146 in a direction to facilitate impingement by the concentrated light rays transmitting through and reflected by the secondary optical element 124.

Figure 9:
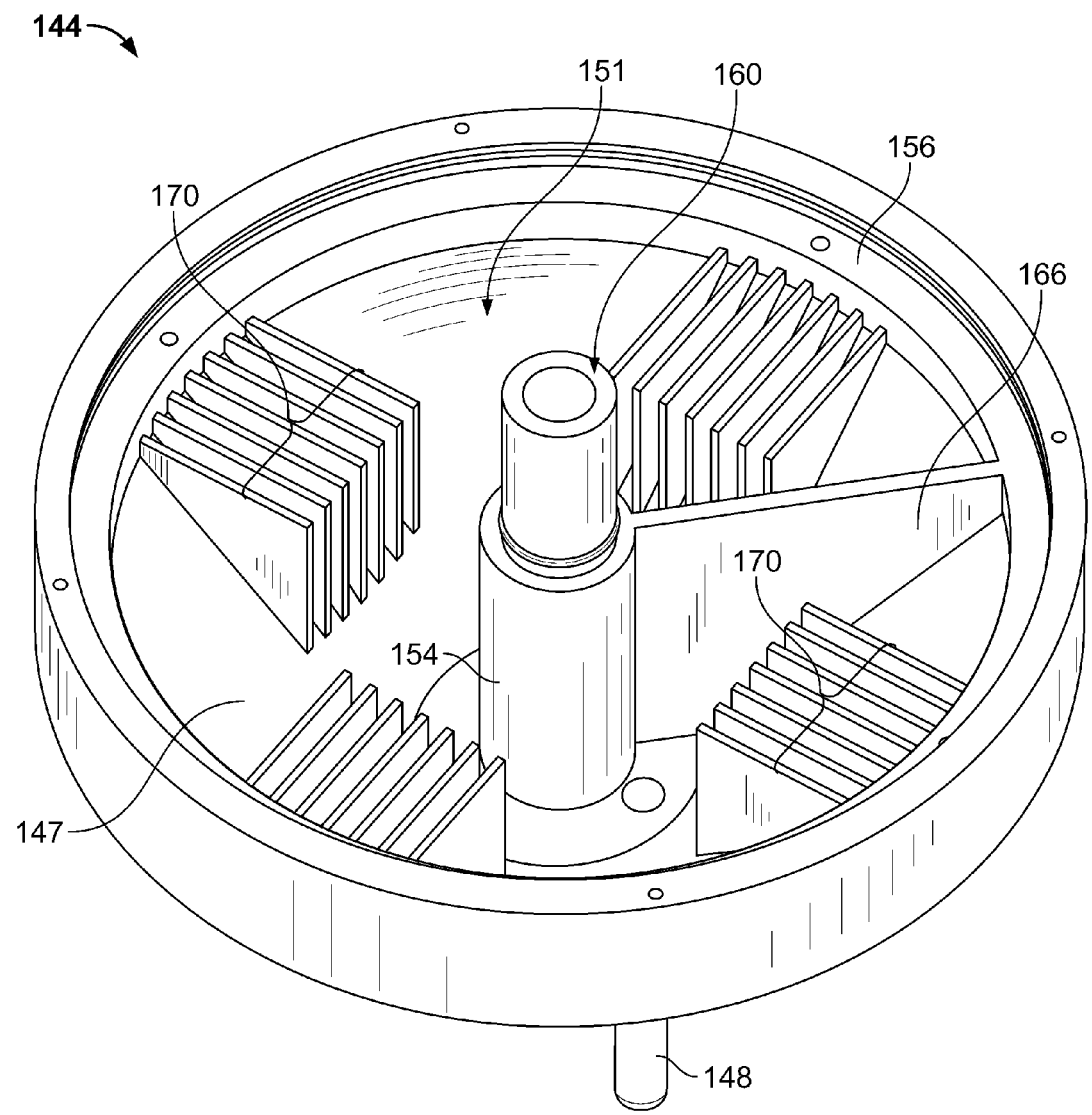
FIG. 9 is a perspective view of a header that may be used with the receiver system shown in FIG. 8.

FIG. 9 is a perspective view of the header 144. The body 147 of the header 144 may form a fluid chamber 151 therein having a column 154 projecting upright from the body 147 and into the fluid chamber 151. A ledge 156 runs along an outer perimeter of the header 144. In one embodiment, the header 144 includes a cover 158 (shown in FIG. 8) that engages the ledge 156 and includes a hole where the column 154 may project therethrough. The ledge 156 and an edge of the cover 158 may be threaded for fastening the cover 158 to the header 144. As such, the fluid chamber 151 is sealed and the dissipation of heat into the ambient air may be reduced. Also, the header 144 may include pipes 148 and 150 (FIG. 8) that extend through mounting post 122 and have openings into the fluid chamber 151. A dividing wall 166 may separate the openings for controlling the flow of fluid. Also shown in FIGS. 8 and 9, the header 144 may have sets of fins 170 that are proximate to the holders 152. More specifically, each holder 152 may have a corresponding set of fins 170 that are on an opposing side of the header 144 and that project into the fluid chamber 151.

When in operation, the header 144 receives a working fluid F into the fluid chamber 151 from one of the pipes, such as the pipe 148 in FIG. 8. The fluid chamber 151 may form a common reservoir where the thermal energy from each energy conversion member 145 may be absorbed into the working fluid F. More specifically, the thermal energy generated around and within each PV cell 146 is absorbed by the corresponding holder 152. Thereafter, the fins 170 may facilitate heat transfer by absorbing the thermal energy within the corresponding holder 152 and dissipating the thermal energy into the working fluid F of the common reservoir. Alternatively, the fluid chamber 151 may not form a common reservoir but may include a plurality of compartments that each have corresponding pipes for directing the flow of fluid therein. The flow of fluid within the common reservoir is directed by the dividing wall 166 (FIG. 9) and the pipes 148 and 150. After flowing around the body 147 and absorbing the thermal energy from the each set of fins 170, the working fluid F may be removed through the other pipe 150. As shown, the working fluid F is directed through the mounting post 122 thereby reducing shade that may result from pipes extending outward from the receiver system 120. However, in alternative embodiments, the working fluid F may be directed through a pipe that runs along the cover 128 or a pipe that is directed outward away from the LC module 100.

Figure 10:
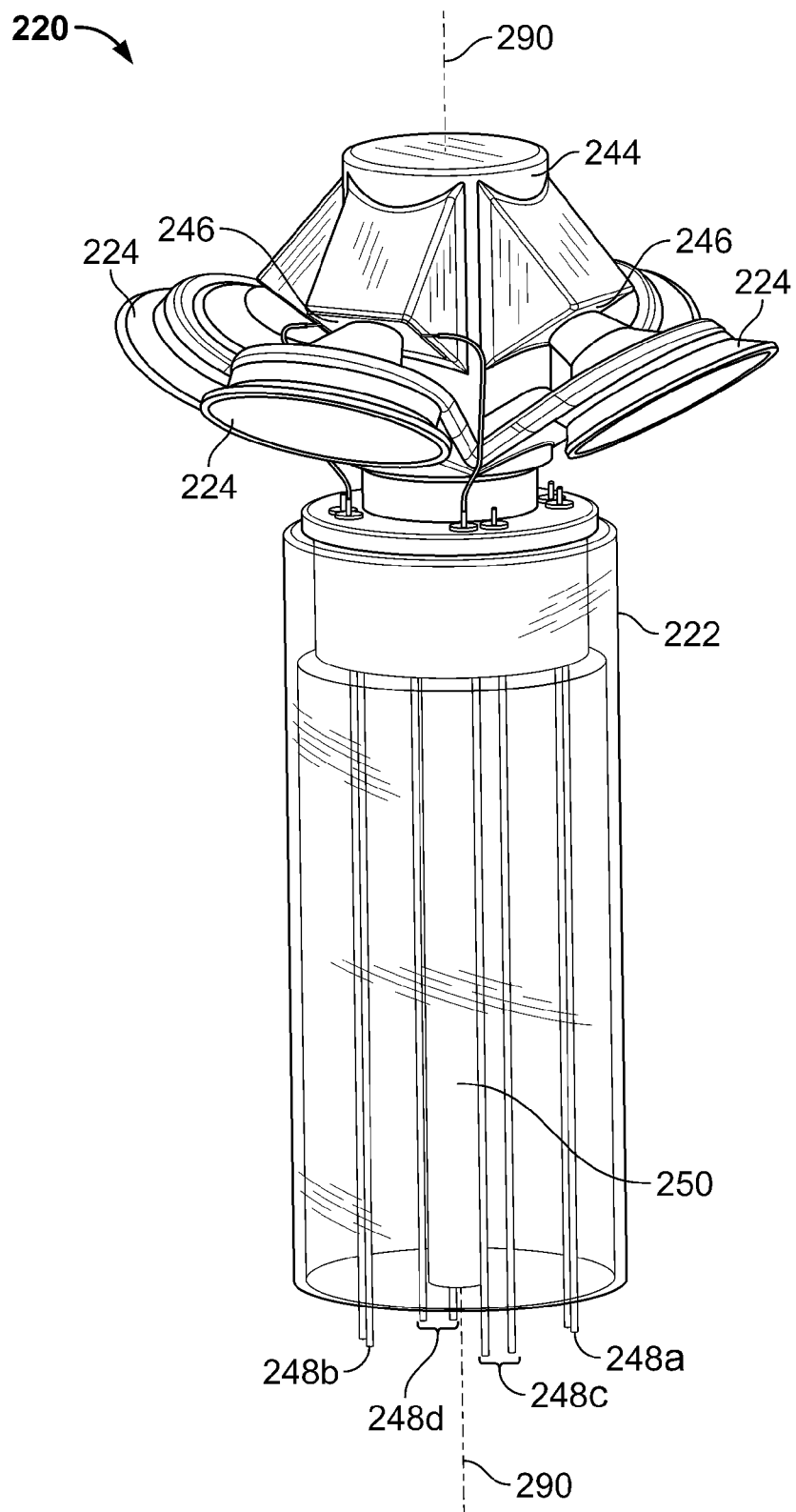
FIG. 10 is a perspective view of another receiver system that may be used with the module shown in FIG. 1.
Figure 11:
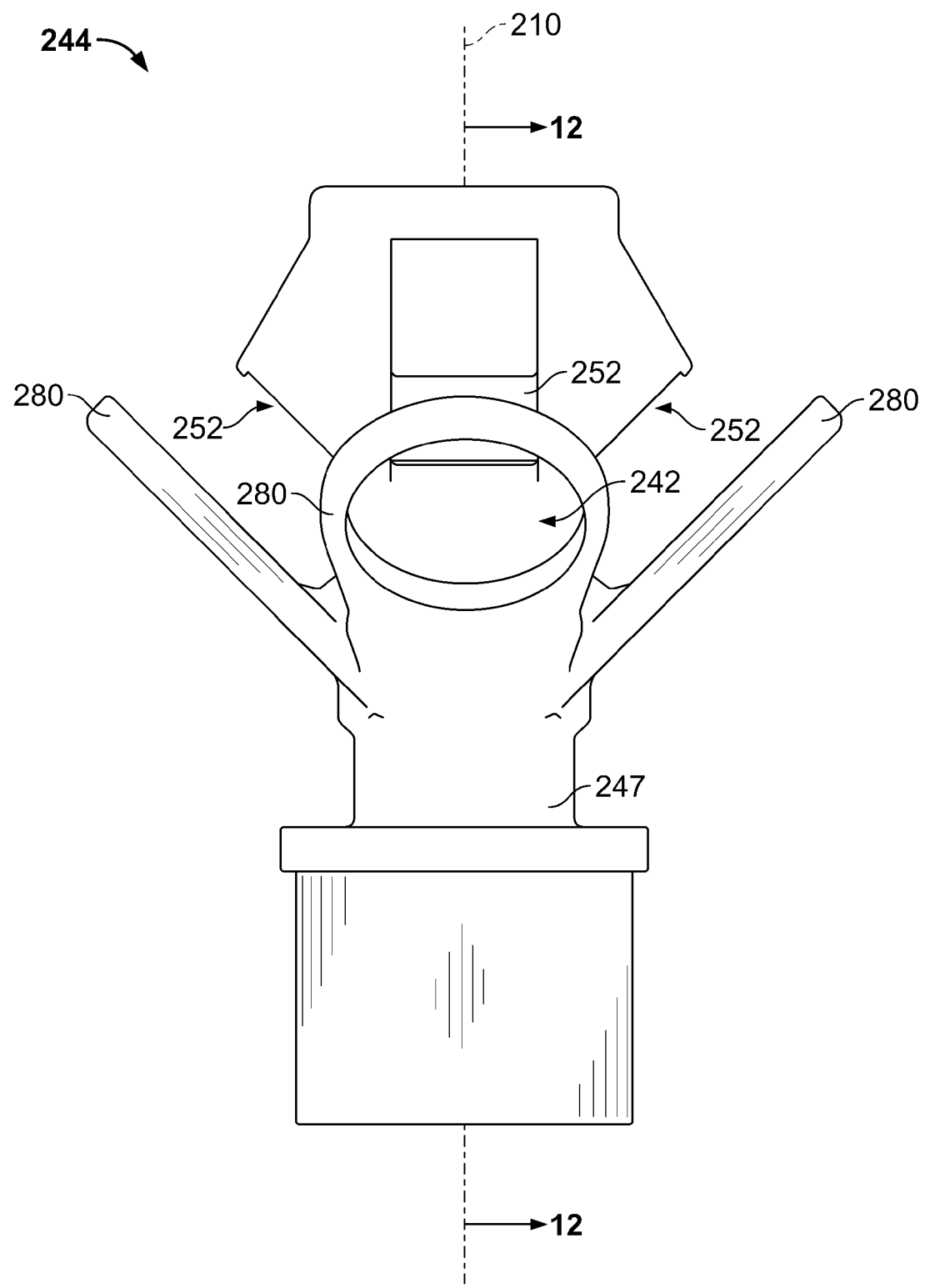
FIG. 11 is side view of another header that may be used with the receiver system shown in FIG. 10.
Figure 12:
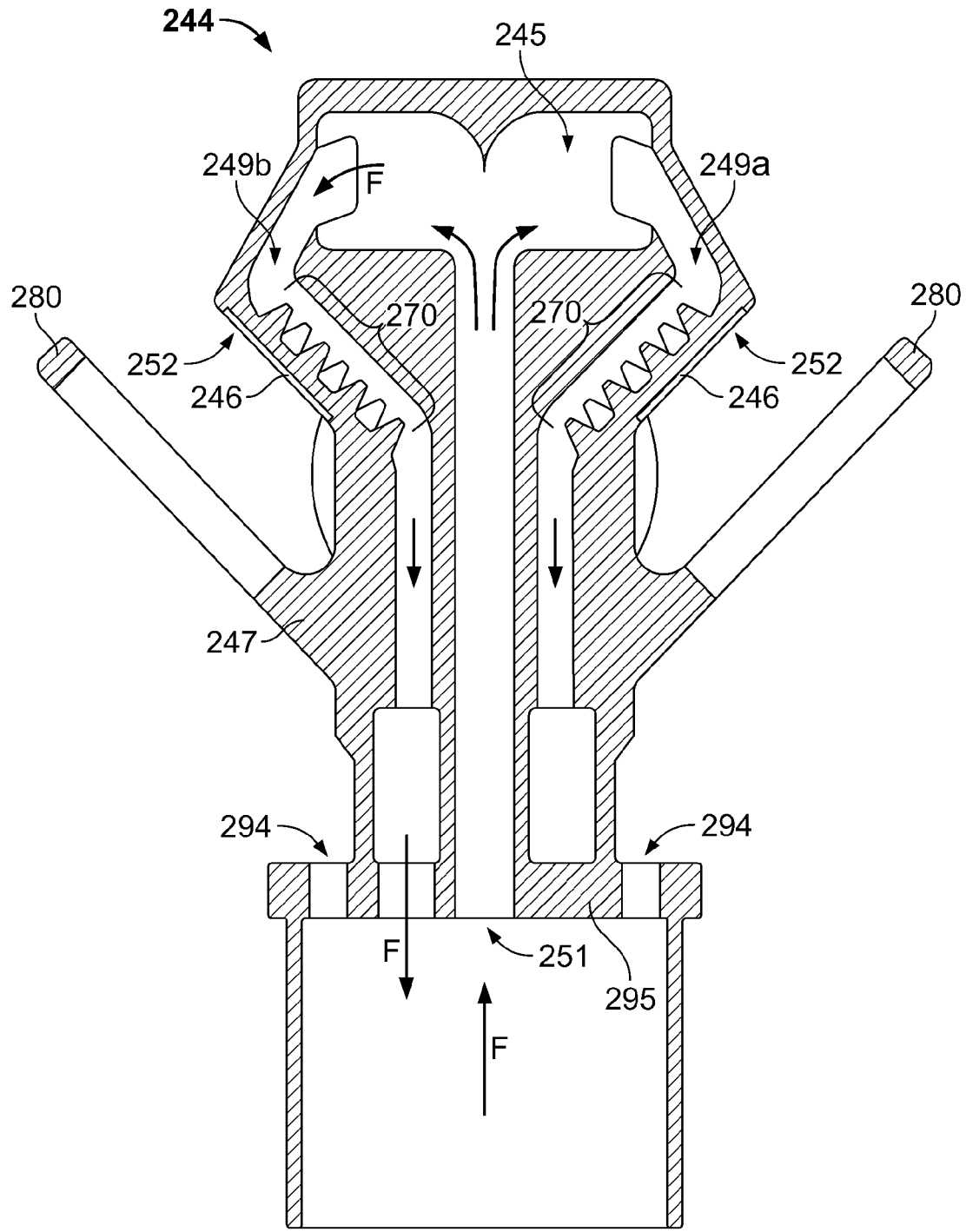
FIG. 12 is a cross-sectional view of the receiver system shown in FIG. 10.

FIGS. 10-12 illustrate a receiver system 220 that is formed in accordance with one embodiment and that may be used with the LC module 100. FIG. 10 is a perspective view of the receiver system 220. As shown, the receiver system 220 includes the header 244 and a plurality of secondary optical elements 224 held by the header 244. The header 244 rests upon a distal end of a mounting post 222. The secondary optical elements 224 may be similarly shaped and formed as the secondary optical elements 124 described with reference to FIGS. 6 and 7. Furthermore, the secondary optical elements 224 may be clustered around a central axis 290 that extends through a center of the mounting post 222 and the receiver system 220. As shown, the secondary optical elements 224 are arranged and held in predetermined positions by the header 244. A plurality of pipes 248A-248D and 250 extend through the mounting post 222 and couple with the receiver system 220. The plurality of pipes 248A-248D and 250 may be used, for example, for providing a path for the working fluid F or providing a conduit for electrical wires. In one embodiment, the pipes 248A-248D are used to house electrical wires that convey electrical energy to and/or away from the receiver system 220 (e.g., from the PV cells 246). Alternatively, the pipes 248A-248D and 250 be outside of the mounting post 222. Also shown in FIG. 10, the PV cells 246 are positioned near ends of corresponding secondary optical elements such that light rays reflected from the corresponding contoured section 104 (FIG. 1) pass through the secondary optical element 224 and onto the PV cell 246 or, alternatively, another energy conversion member. The receiver system 220 functions similarly as the receiver system 120 (FIG. 1) in that the receiver system 220 holds the secondary optical elements 224 in predetermined positions so that the light rays may be directed onto the energy conversion member where the light rays are converted into electrical energy and/or the thermal energy is absorbed therefrom.

FIG. 11 is side view of a header 244 that may be used with the receiver system 220, and FIG. 12 is a cross-sectional view of the header 244 taken along the line 12-12 shown in FIG. 11. The header 244 includes a plurality of element grips 280 that are distributed around the central axis 290. Each element grip 280 is configured to hold a corresponding secondary optical element 224 (FIG. 10) near or within a focal region 125 (FIG. 3). The secondary optical element 224 may be oriented to receive the light rays reflected from a corresponding contoured section 104 (FIG. 1) and reflect/refract the light rays onto the PV cell 246. In FIG. 12, the element grips 280 form rings through which the secondary optical elements 224 are inserted. Fastening devices, such as screws or clamps, may be used to fasten the corresponding secondary optical element 224 into a fixed position. Also shown, the header 244 includes a plurality of holders 252 where each holder 252 is configured to hold the corresponding PV cell 246.

As illustrated in FIG. 12, the header 244 includes a body 247 that includes a fluid chamber 245 that is coupled to a plurality of working fluid passages 249A-249D. The body 247 may be integrally formed and/or shaped to include the fluid chamber 245, passages 249A-249D, element grips 280, and holders 252 or, alternatively, the body 247 may include a plurality of parts. The fluid chamber 245 is positioned above the holders 252. In operation, the fluid chamber 245 receives the working fluid F from the inlet pipe 250 and the working fluid F is diverted into passages 249A-249D. Each passage 249A-249D has a path that extends downward toward the mounting post 222 (FIG. 10) and may run under the fluid chamber 245. The paths of the passages 249A-249D may pass proximate to the holders 252 and substantially orthogonal to the direction of the impinging light rays against the holders 252. As the passages 249A-249D pass proximate to the holders 252, a plurality of fins 270 may project from the wall of the corresponding passage in order to facilitate heat transfer from the corresponding holder 252. Furthermore, the passages 249A-249D may be shaped to substantially cover the surface area of the corresponding PV cell 246 in order to facilitate heat transfer. Also shown in FIG. 12, the pipes 249A-249D may run adjacent to the pipe 250. The passages 249A-249D may facilitate directing the working fluid F to, for example, a fluid conversion module 608 (shown in FIG. 19). Furthermore, the pipes 248A-248D (FIG. 10), the passages 249A-249D, and the pipe 250 may all fit within the mounting post 222.

Also shown in FIG. 12, the header 244 includes a plurality of holes 294 distributed around a base 295 of the header 244.

Each hole 294 passes through the base 295 and may connect with one of the pipes 248A-248D (FIG. 10) for allowing an electrical wire(s) to pass through the base 295 and connect with a corresponding PV cell 246.

When in operation, the pressure of the working fluid F and the shape of the fluid chamber 245 direct the flow of the working fluid F into passages 249A-249D. Unlike the fins 170 of the receiver system 120, the fins 270 are not positioned within a common reservoir. Rather, the working fluid F is separated into the passages 249A-249D and the corresponding set of fins 270 for each passage 249A-249D facilitates heat transfer from the corresponding PV cell 246. Because the fluid chamber 245 is positioned above sets of fins 270, the receiver system 220 has a reduced cross-sectional area from the light source's perspective and may cause a smaller shadow upon the primary optical element 102.

Figure 13:
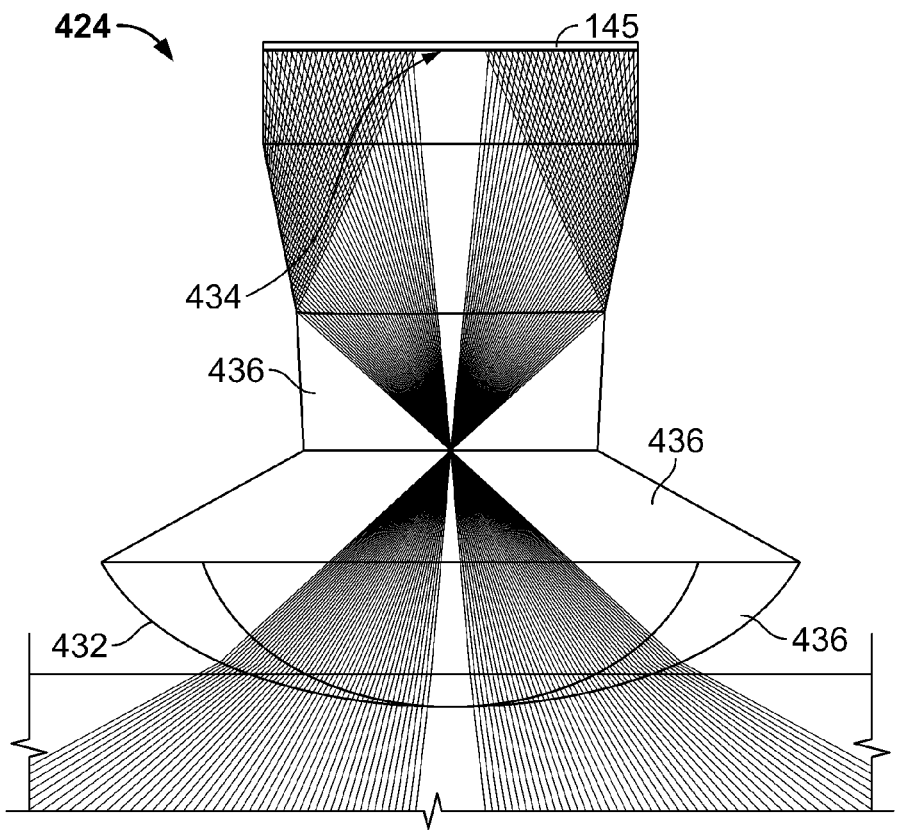
FIGS. 13 and 14 illustrate ray collimation through another optical element that may be used with the module shown in FIG. 1 or FIG. 12.
Figure 14:
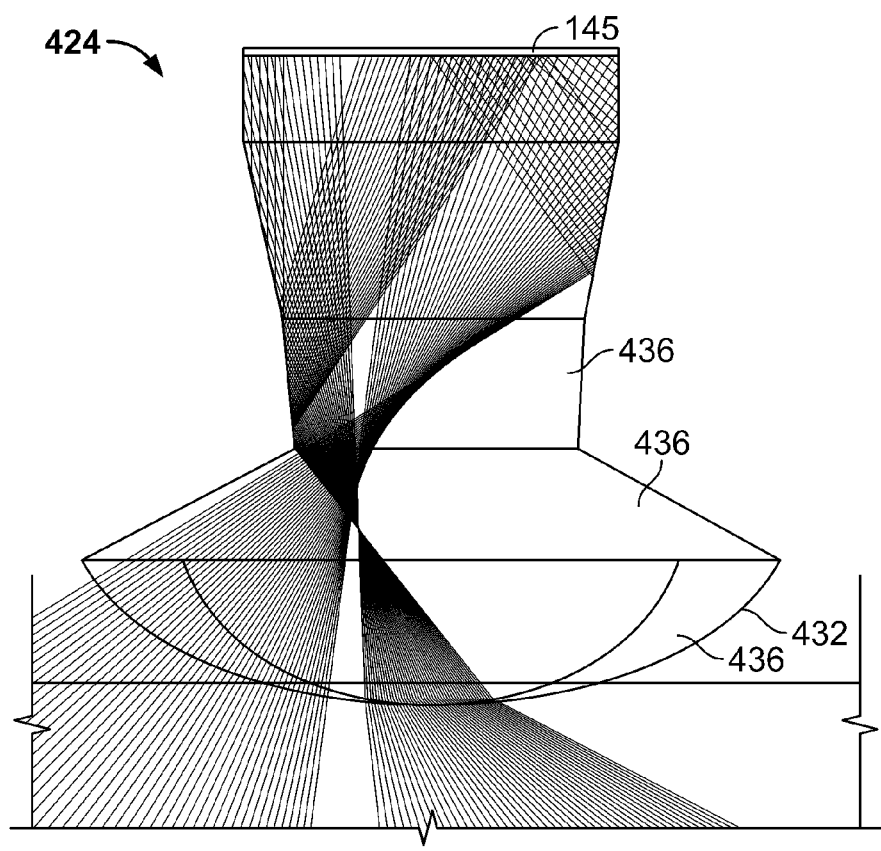

FIGS. 13 and 14 illustrate ray collimation through another secondary optical element 424. In one embodiment, the secondary optical element 424 is integrally formed from a solid material and operates on the principle of total internal reflection. For example, the contours of the secondary optical element 424 may be described by the equations:

$$z = \frac{c_v \rho^2}{1 + \sqrt{1 - (1+K)c_v^2 \rho^2}}$$

$$\rho^2 = x^2 + y^2$$

$$c_v = 1/r$$

with K a conic constant, where K=0 for a spheroid; −1<K<0 for an ellipsoid; K<1 for a hyperboloid; and K>0 for an oblate spheroid.

In FIGS. 13 and 14, the secondary optical element 424 is a solid material that extends between the inlet surface 432 and an outlet surface 434 (FIG. 13). Moreover, the secondary optical element 424 has a plurality of portions 436 with varying diameters. The surfaces 432 and 434 and the portions 436 may be modified in different embodiments to serve different objectives. For example, by reducing the curvature of the surface 432, the level of concentration provided by the secondary optical element 424 may be increased at the expense of a reduced acceptance angle. Further, the outlet surface 434 may be curved to effect the distribution of light onto the energy conversion member 145. Similar to the secondary optical element 124 described above, the secondary optical element 424 may be designed to optimize the acceptance angle for the LC module 100 and/or to provide a more uniform distribution of the light onto the energy conversion member 145.

Figure 15:
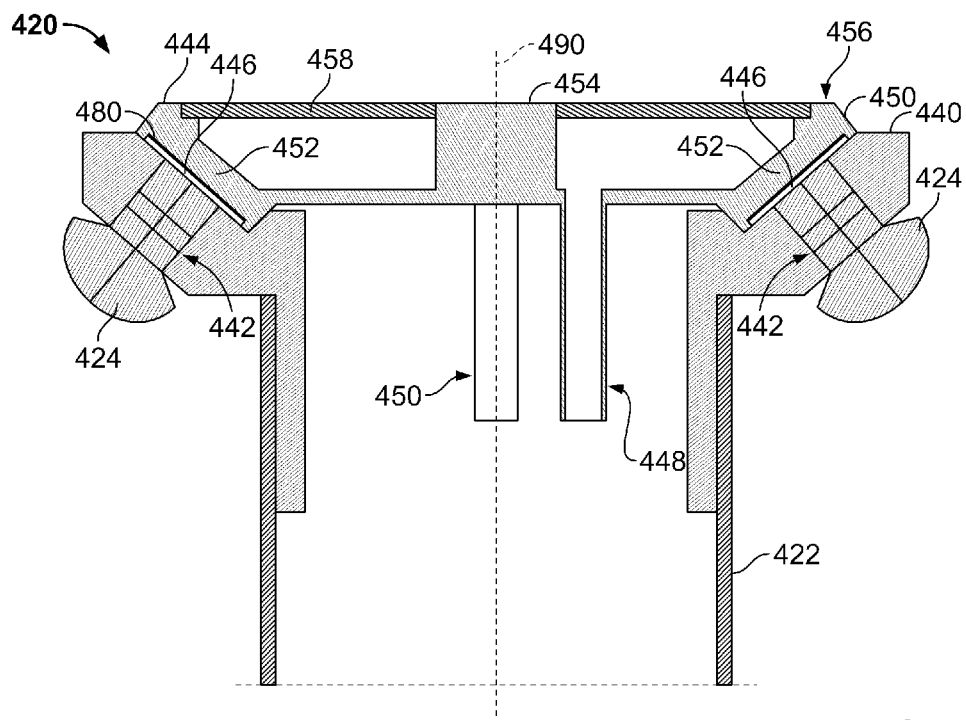
FIG. 15 is a cross-sectional view of another receiver system that may be used with the module shown in FIG. 1.

FIG. 15 is an enlarged cross-sectional view of the receiver system 420, which includes a neck support 440 and a header 444. The header 444 is held by the neck support 440 or, in another embodiment, is integrally formed with the neck support 440. The neck support 440 is configured to engage within a shaft of a mounting post 422. Alternatively, the neck support 440 may be integrally formed with the mounting post 422. The neck support 440 has a plurality of openings 442 for holding the secondary optical elements 424. The openings 442 are oriented to direct the secondary optical elements 424 toward the associated contoured section 404 (FIG. 1). As shown, the secondary optical elements 424 are at an angle with respect to a central axis 490 so that the secondary optical elements 424 can receive and direct the light rays reflected by the associated contoured section 404. The header 444 includes a body 447 that forms a plurality of holders 452 for holding an energy conversion member, such as a PV cell 446. The PV cell 446 may be attached thereon using, for example, a thermally conductive adhesive 480. The holders 452 are configured to orient the PV cell 446 in a direction to facilitate impingement by the concentrated light rays transmitting through the secondary optical element 424.

Figure 16:
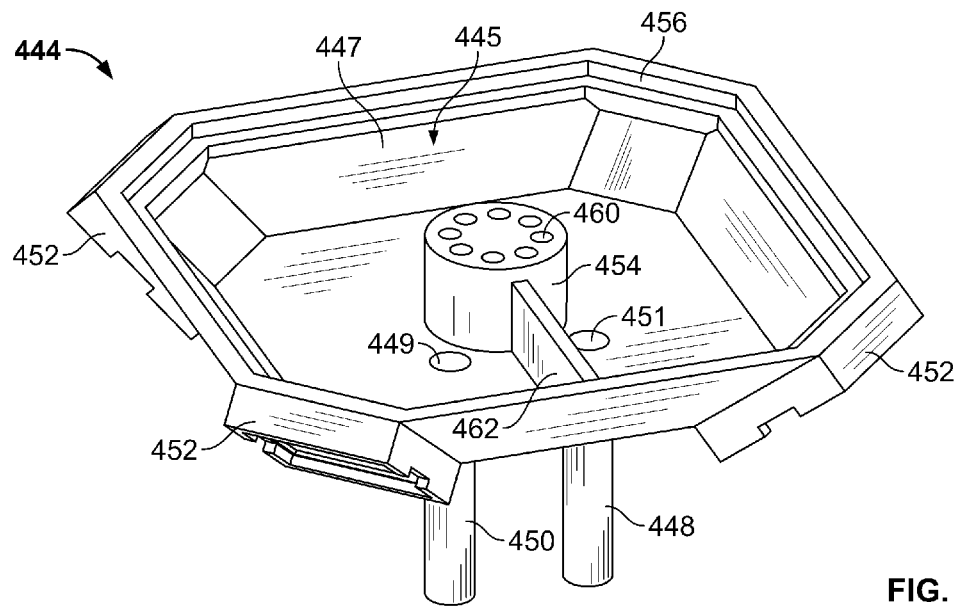
FIG. 16 is a perspective view of a header that may be used with the receiver system shown in FIG. 15.

FIG. 16 is a perspective view of the header 444. The holders 452 are shaped or formed to hold the PV cell 446. The body 447 may also define a fluid chamber 445 therein having a column 454 projecting upright from the body 447 into the fluid chamber 445. A ledge 456 runs along an outer perimeter of the header 444. In one embodiment, the header 444 includes a cover 458 (FIG. 15) that engages the ledge 456 and includes a hole for circumscribing the column 454. As such, the fluid chamber 445 is sealed and heat is less likely to dissipate into the ambient air. As shown in FIG. 16, the column 454 may have a plurality of conduits 460 extending therethrough which may be used for electrical wires. Also, the header 444 may include pipes 448 and 450 that extend through the mounting post 422 and have an opening 449, 451, respectively, into the fluid chamber 445. A dividing wall 462 may separate the openings 449 and 451.

When in use, the header 444 receives a working fluid F into the fluid chamber 445 through pipes 448 and 450. The fluid forms a common reservoir where the thermal energy from each energy conversion member 145 may be absorbed through the holders 452. The body 447 supports the plurality of PV cells 446 at positions distributed about the fluid chamber 445 such that the working fluid F in the common reservoir flows proximate to the PV cells 446 in order to absorb the thermal energy. Although not shown in FIG. 15, a plurality of heat sinks, such as the sets of fins 170 (FIG. 8), may be coupled behind the PV cells 446 to facilitate the transfer of thermal energy into the working fluid F. The electrical wiring may run above cover 458 so as to not be damaged or affected by the working fluid.

The receiver systems 420, 220, and 120 described above have substantially compact bodies. For example, the corresponding fluid chamber 151 and 451 in the receiver systems 420 and 120, respectively, are substantially within the same plane of the corresponding holders. Furthermore, parts of the receiver system 120 do not extend beyond the cover 128. The compactness of the described embodiments may be more aerodynamic than conventional systems and cause less shadow to fall upon the primary optical element 120. In addition, the receiver system 220 may have a reduced cross-sectional area with respect to other systems as described above.

Figure 17:
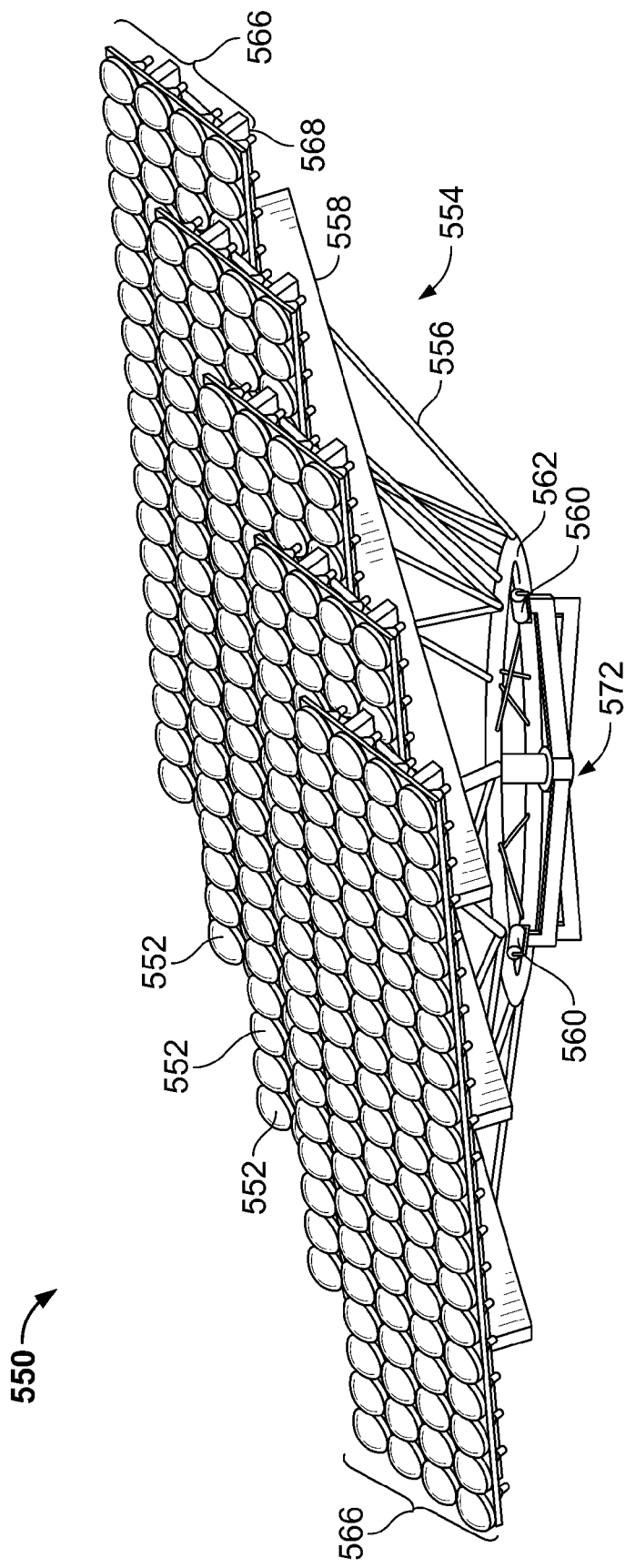
FIG. 17 is a perspective view of a light concentrating system that includes an array of light concentrating modules shown in FIG. 1.
Figure 18:
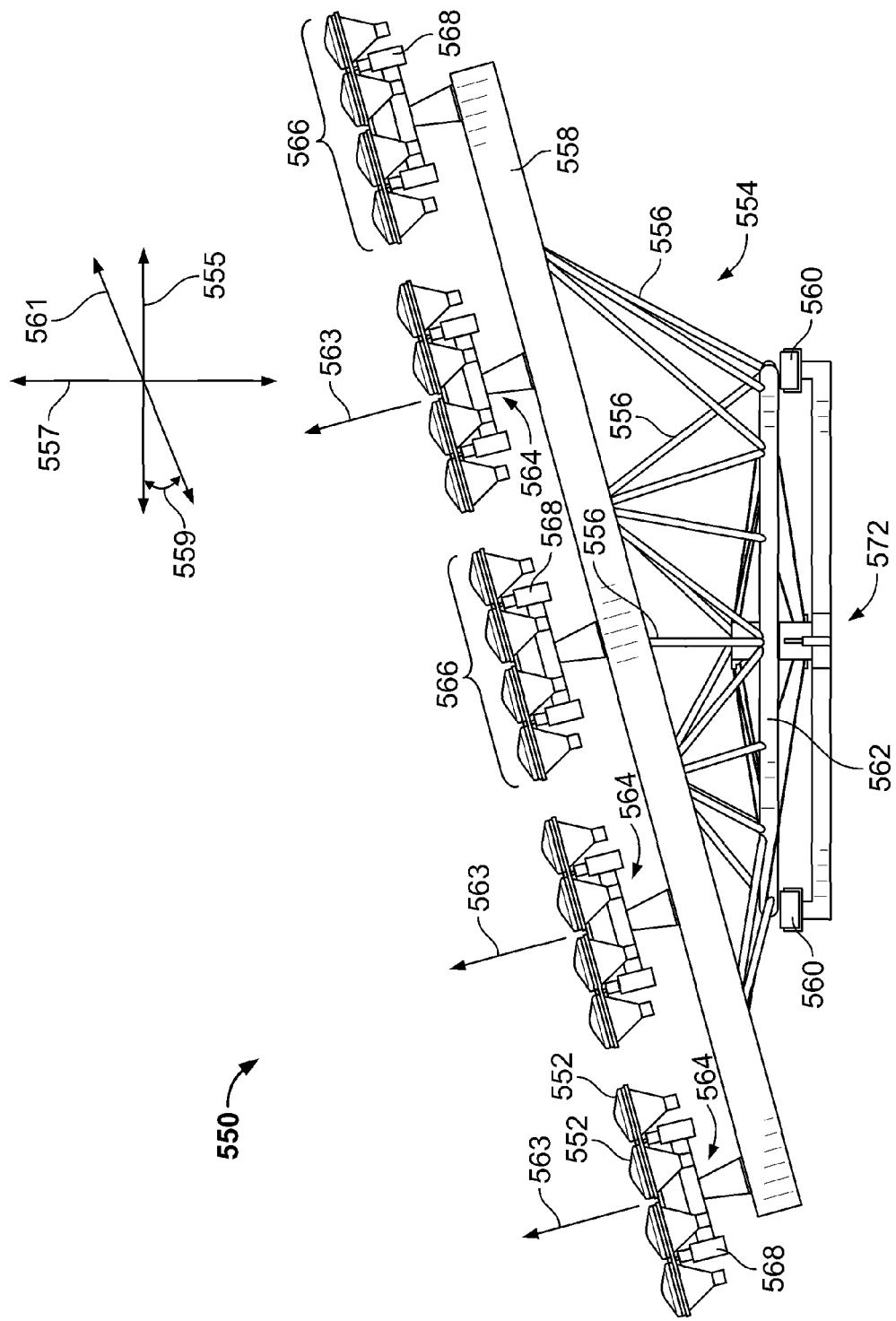
FIG. 18 is a side view of the light concentrating system shown in FIG. 17.

FIGS. 17 and 18 are a perspective view and a side view, respectively, of a light concentrating (LC) system 550 that may be formed in accordance to one embodiment. In one embodiment, the LC system 550 is a solar panel. The LC system 550 includes a plurality of LC modules 552 for converting light energy into electricity and/or usable thermal energy. As shown, the LC modules 552 are arranged in groups 566 of rows and are mounted onto a tracking structure 554. Although the LC system 550 is discussed with the LC modules 552 being mounted onto tracking structure 554, the LC system 550 is not limited to such use and may, alternatively, comprise a plurality of the LC modules 552 separately supported from the ground in some manner that allows the LC modules to track the sun.

The tracking structure 554 may be capable of manipulating the orientation of the LC modules 552 (e.g., by tilting and/or rotating the LC modules 552) so that the LC modules 552 are substantially aligned with a light source (not shown). The tracking structure 554 includes an inclined platform grid 558 for holding the LC modules 552, a circular guide 562, and a plurality of support bars 556 that extend from the circular guide 562 to the inclined platform grid 558. The tracking structure 554 may be fabricated from any sturdy material, such as plastic or a hollow metal alloy tube, such as extruded aluminum, or solid bar. The tracking structure 554 may also include wheels 560 attached to the circular guide 562. The circular guide 562 may be coupled to a servo motor 572 for rotating the circular guide 562 and the tracking structure 554 along an axis parallel with respect to a vertical axis 557 (FIG. 18). As shown in FIG. 18, the groups 566 of rows of the LC modules 552 may rest upon rotatable supports 568 which are held by stands 564. Another servo motor (not shown) may be connected to the rotatable supports 568 in a manner to rotate the LC modules 552 along the plane formed by the vertical axis 557 and a horizontal axis 555 (FIG. 18).

The tracking structure 554 may vary in structure and configuration based in part on an environment in which the tracking structure 554 operates. As shown in FIG. 18, the tracking structure 554 maintains the platform grid 558 at a desired inclined acute angle 559 with respect to horizontal and vertical axes 555 and 557. The acute angle 559 is measured between the horizontal axis and an inclined plane (denoted by arrow 561) that extends along the surface of the platform grid 558. The LC modules 552 are also distributed (e.g., in groups of rows) along the inclined plane. As shown in FIG. 18, the LC modules 552 are oriented to face in an incident direction 563 that projects at an angle with respect to the platform grid 558.

FIG. 19 is a schematic illustrating an energy conversion system 600 in accordance with one embodiment. The energy conversion system 600 includes at least one solar panel, such as the LC system 550. The system 600 has a plurality of LC modules 552 (FIG. 17) that are connected to a fluid circuit 606. The energy conversion system 600 also includes a source locator 602 that determines the location of the light source relative to the system 600. For example, the source locator 602 may include a sensor that detects energy from the light source and/or the source locator 602 may use embedded astronomical tables that contain coordinates of the expected location of the light source based on the physical location of the source locator 602 and the date and time of the year. The source locator 602 is communicatively coupled to a motion control tracking unit 604 and sends information relating to the light source location to the tracking unit 604. The tracking unit 604 is communicatively coupled to one or more servo motors. The tracking unit 604 can store information relating to the incident direction 563 (FIG. 18) for the LC modules 552. When the tracking unit 604 receives location information from the source locator 602 the tracking unit 604 determines if the incident direction 563 for the LC modules 552 is directed toward the light source. If the incident direction 563 is not directed toward the light source, the tracking unit 604 instructs the servo motors to tilt and/or rotate, respectively, the groups 566 of LC modules 552 so that the incident direction 563 is directed toward the light source.

The energy conversion system 600 also includes a fluid conversion module 608 coupled in flow communication to the fluid circuit 606. The direction of flow of the working fluid F is indicated by arrows throughout the fluid circuit 606. In one embodiment, the fluid conversion module 608 receives the heated working fluid F and converts the absorbed thermal energy into electrical energy. Although not shown, the fluid conversion module 608 may include a pump, valves, tanks, and/or other fluid devices that facilitate regulating the flow of the working fluid F. Alternatively, the fluid conversion module 608 may store the heated working fluid F and/or direct the flow of the working fluid F to other locations where, for example, the working fluid F may be used for heating.

A method for manufacturing a LC module is also provided. The method includes providing a primary optical element having a reflective surface that forms a plurality of contoured sections. The contoured sections are configured to reflect light toward corresponding focal regions. The method also includes coupling a receiver system to the primary optical element. The receiver system includes a plurality of secondary optical elements held near the corresponding focal regions and a plurality of energy conversion members. Each secondary optical element may be oriented to direct light rays reflected from the corresponding contoured section toward a corresponding energy conversion member. Furthermore, the receiver system may include a fluid chamber configured to direct a working fluid proximate to the energy conversion members where the working fluid may absorb thermal energy from the energy conversion member.

It is to be understood that the above description is intended to be illustrative, and not restrictive. As such, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. A light concentrating module to be coupled in flow communication with a fluid conversion module for at least one of storing, using, converting, or disposing of thermal energy, the light concentrating module comprising:

a primary optical element having a reflective surface comprising a plurality of contoured sections, each contoured section shaped to reflect and substantially concentrate impinging light toward a corresponding focal point at a point-focal region; and a receiver system joined to the primary optical element and having a plurality of energy conversion members positioned proximate to respective point-focal regions for transforming the reflected light into at least one of electrical and thermal energy, the energy conversion members having different orientations for receiving the reflected light from the contoured sections, the receiver system having at least one working fluid passage for carrying a working fluid proximate to the energy conversion members to absorb the thermal energy, the at least one working fluid passage being configured to fluidicly couple to a fluid circuit to convey the working fluid between the energy conversion members and the fluid conversion module;

wherein the receiver system includes a plurality of secondary optical elements positioned proximate to the energy conversion members, the secondary optical elements configured to direct the light toward corresponding energy conversion members;

wherein the energy conversion members are located a distance away from the primary optical element, the energy conversion members having respective surfaces that are configured to receive and transform the reflected light, each of said surfaces facing in respective downward directions back toward the corresponding contoured sections to receive the reflected light; and wherein the energy conversion members are clustered around a central axis extending from the primary optical element, the central axis extending parallel to light rays of the impinging light when the primary optical element is at a desired alignment, wherein the downward directions form acute angles with respect to said central axis.

2. The module in accordance with claim 1 wherein the receiver system includes at least one set of fins extending into a flow of the working fluid and proximate to a corresponding conversion member, the set of fins facilitating transfer of thermal energy from the corresponding energy conversion member.

3. The module in accordance with claim 1 wherein at least one energy conversion member includes a photovoltaic (PV) cell for transforming the reflected light into electrical energy.

4. A light concentrating module comprising:

a primary optical element having a reflective surface comprising a plurality of contoured sections, each contoured section shaped to reflect and substantially concentrate impinging light toward a corresponding focal point at a point-focal region;

a receiver system joined to the primary optical element and having a plurality of energy conversion members positioned proximate to respective point-focal regions for transforming the reflected light into at least one of electrical and thermal energy; and a mounting post having a proximal end that is secured to the primary optical element and a distal end that is located proximate the point-focal regions of the primary optical element, the mounting post extending between the proximal and distal ends and supporting the energy conversion members proximate to the distal end, the energy conversion members being oriented to receive the reflected light from respective contoured sections, the mounting post having working fluid passages extending between the proximal and distal ends for carrying working fluid to and from the energy conversion members in order to absorb the thermal energy;

wherein the receiver system includes a plurality of secondary optical elements positioned proximate to the energy conversion members, the secondary optical elements configured to direct the reflected light toward corresponding energy conversion members;

wherein the energy conversion members have respective surfaces that are configured to receive and transform the reflected light, each of said surfaces facing in respective downward directions back toward the corresponding contoured sections to receive the reflected light; and wherein the energy conversion members are clustered around a central axis extending from the primary optical element along the mounting post, the central axis extending parallel to light rays of the impinging light when the primary optical element is at a desired alignment, wherein the downward directions form acute angles with respect to said central axis.

5. The module in accordance with claim 4 wherein the proximal end of the mounting post is secured to the primary optical element at a central area where the contoured sections of the primary optical element are located adjacent one another, the post extending from the central area to the distal end, the receiver system being held at the distal end of the post.

6. The module in accordance with claim 4 wherein the receiver system includes at least one set of fins extending into a flow of the working fluid and proximate to a corresponding conversion member, the set of fins facilitating transfer of thermal energy from the corresponding energy conversion member.

7. The module in accordance with claim 4 wherein at least one energy conversion member includes a photovoltaic (PV) cell for transforming the reflected light into electrical energy.

8. A light concentrating module comprising:

a primary optical element having a reflective surface comprising a plurality of contoured sections, each contoured section shaped to reflect and substantially concentrate impinging light toward a corresponding focal point at a point-focal region, the corresponding point-focal regions being located proximate to each other in a convergence area;

a receiver system having a plurality of energy conversion members positioned proximate to respective point-focal regions for transforming the reflected light into at least one of thermal and electrical energy; and a header of the receiver system that is located proximate to the convergence area and comprising a body that supports the plurality of energy conversion members, the energy conversion members being held by the body at different orientations for receiving the reflected light from the contoured sections, the body having at least one working fluid passage that directs working fluid proximate to the energy conversion members to absorb thermal energy therefrom;

wherein the receiver system includes a plurality of secondary optical elements positioned proximate to the energy conversion members, the secondary optical elements configured to direct the reflected light toward corresponding energy conversion members;

wherein the energy conversion members are located a distance away from the primary optical element, the energy conversion members having respective surfaces that are configured to receive and transform the reflected light, each of said surfaces facing in respective downward directions back toward the corresponding contoured sections to receive the reflected light; and wherein the energy conversion members are clustered around a central axis extending from the primary optical element, the central axis extending parallel to light rays of the impinging light when the primary optical element is at a desired alignment, wherein the downward directions form acute angles with respect to said central axis.

9. The module in accordance with claim 8 further comprising a mounting post extending from the primary optical element toward the point-focal regions and to a distal end, the header coupled to the distal end.

10. The module in accordance with claim 8 wherein the receiver system includes at least one set of fins extending into a flow of the working fluid and proximate to a corresponding conversion member, the set of fins facilitating transfer of thermal energy from the corresponding energy conversion member.

11. The module in accordance with claim 8 wherein at least one energy conversion member includes a photovoltaic (PV) cell for transforming the reflected light into electrical energy.

12. The module in accordance with claim 1 wherein the primary optical element is integrally formed and the reflective surface is a continuous surface that is shaped to have the plurality of contoured sections.

13. The module in accordance with claim 1 wherein at least one of the energy conversion members comprises a plurality of multijunction solar cells.

14. The module in accordance with claim 4 wherein the working fluid passages direct a flow of incoming working fluid through the mounting post to a location above the energy conversion members, the working fluid flowing generally along the central axis when absorbing thermal energy from the energy conversion members, the outgoing working fluid flowing through the mounting post.

15. The module in accordance with claim 4 wherein the working fluid passages include a plurality of separate working fluid passages, each separate working fluid passage directing a working fluid proximate to a corresponding one energy conversion member to absorb thermal energy therefrom.

16. The module in accordance with claim 1 wherein the secondary optical elements and energy conversion members are arranged in a 1:1 relationship such that each of the secondary optical elements directs errant light rays toward only a single energy conversion member and each of the energy conversion members receives light from only a single secondary optical element.

17. The module in accordance with claim 16 wherein each of the secondary optical elements receives light from only a single contoured section, the point-focal region associated with said single contoured section occurring proximate to or within the respective secondary optical element.

18. The module in accordance with claim 8 wherein the body includes a fluid chamber that forms a common reservoir, the working fluid flowing through the fluid chamber absorbing thermal energy from each of the energy conversion members.

19. The module in accordance with claim 1 wherein the acute angles are approximately 45°.

20. The module in accordance with claim 1 wherein the contoured sections are arranged in a 1:1 relationship with respect to the energy conversion members such that each of the energy conversion members only receives light that is substantially concentrated toward a single point-focal region.

21. The module in accordance with claim 1 wherein the downward direction of each of the energy conversion members extends along a member axis from the energy conversion member toward the corresponding contoured section, the corresponding secondary optical element having a cross-section taken perpendicular to the member axis that extends completely around the member axis.

22. The module in accordance with claim 21 wherein the cross-sections of the secondary optical elements are circular.

23. The module in accordance with claim 1 wherein the secondary optical elements are configured to completely surround the reflected light when viewed in a direction that is opposite that of the respective downward direction.

24. The module in accordance with claim 1 further comprising a mounting post extending from the primary optical element toward the point-focal regions and to a distal end, the receiver system coupled to the distal end.

25. The module in accordance with claim 4 wherein the contoured sections are arranged in a 1:1 relationship with respect to the energy conversion members such that each of the energy conversion members only receives light that is substantially concentrated toward a single point-focal region.

26. The module in accordance with claim 8 wherein the contoured sections are arranged in a 1:1 relationship with respect to the energy conversion members such that each of the energy conversion members only receives light that is substantially concentrated toward a single point-focal region.

* * * * *